US 6,556,091 B1

(12) United States Patent
Muto et al.

(10) Patent No.: US 6,556,091 B1
(45) Date of Patent: Apr. 29, 2003

(54) LOW NOISE OSCILLATOR HAVING DISSIMILAR MOS GATE STRUCTURES

(75) Inventors: Masaki Muto, Osaka (JP); Yoshihisa Mochida, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/446,781

(22) PCT Filed: Apr. 26, 1999

(86) PCT No.: PCT/JP99/02206
§ 371 (c)(1),
(2), (4) Date: Mar. 20, 2000

(87) PCT Pub. No.: WO99/56386
PCT Pub. Date: Nov. 4, 1999

(30) Foreign Application Priority Data

Apr. 27, 1998 (JP) ............................................. 10-116755

(51) Int. Cl.[7] ................................................. H03B 5/32
(52) U.S. Cl. ................................ 331/116 FE; 331/158; 331/175; 331/108 A
(58) Field of Search .......................... 331/116 FE, 158, 331/175, 74, 107 R, 108 A; 327/365, 389, 391, 392

(56) References Cited

FOREIGN PATENT DOCUMENTS

| JP | 49-75053 | 7/1974 |
| JP | 51-49658 | 4/1976 |
| JP | 53-149754 | 12/1978 |

OTHER PUBLICATIONS

Japanese search report for PCT/JP99/02206 dated Apr. 26, 1999.
English translation of Form PCT/ISA/210.

*Primary Examiner*—Arnold Kinkead
(74) *Attorney, Agent, or Firm*—RatnerPrestia

(57) ABSTRACT

An oscillator which is used for a portable telephone or the like, comprises a transistor fabricated by MOS process, and entails a low level of noise other than the desired oscillation frequency. The oscillator includes quartz oscillating element 1 and a first amplifier 3 connected between input terminal 4 and output terminal 2. The first amplifier 3 has a first P-type transistor 11 and a first N-type transistor 12 both fabricated by MOS process. A gate 23 of the first P-type transistor 11 spans between a P-type source diffused region 22 and a P-type drain diffused region 21. A gate of the first N-type transistor 12 spans between an N-type source diffused region 18 and an N-type drain diffused region 19. The span of the gate 20 of the first N-type transistor 12 is longer than that of the gate 23, and the field strength is low, thereby lowering the noise level other than the oscillation frequency.

3 Claims, 5 Drawing Sheets

Fig. 5

LIST OF REFERENCE NUMERALS

1. Quartz oscillating element
2. Output terminal of quartz oscillating element
3. First amplifier
4. Input terminal of quartz oscillating element
5. Second amplifier
6. Oscillation output terminal
7, 10. Capacitors
8. Variable capacitance diode
9. Voltage control terminal
11. First P-type transistor
12. First N-type transistor
13. Power supply terminal
14. Grounding terminal
15. Second P-type transistor
16. Second N-type transistor
17. P-type substrate
18. N-type source diffused region
19. N-type drain diffused region
20, 23. Gates
21. P-type drain diffused region
22. P-type source diffused region
24. N well diffusion region
A. Noise level of oscillation output of the present invention.
B. Noise level of oscillation output of a prior art.

US 6,556,091 B1

LOW NOISE OSCILLATOR HAVING DISSIMILAR MOS GATE STRUCTURES

This Application is a U.S. National Phase Application of PCT International Application PCT/JP99/02206 filed Apr. 26, 1999.

1. Technical Field

The present invention relates to an oscillator for use in portable telephones and the like.

2. Background Art

Generally, this type of oscillator used to comprise an oscillating element and a first amplifier connected to input and output terminals of the oscillating element. In order to attain a small size and a low cost, the first amplifier used to comprise a first P-type transistor and a first N-type transistor both fabricated by MOS process. In other words, a gate of the first P-type transistor and a gate of the first N-type transistor of the first amplifier are connected to the output terminal of the oscillating element. And a drain of the first P-type transistor and a drain of the first N-type transistor are connected to the input terminal of the oscillating element. Furthermore, a source of the first P-type transistor is connected to a power supply terminal and a source of the first N-type transistor is connected to a grounding terminal. Also, the gate of the first P-type transistor is configured in a manner such that it is spanned between the P-type source diffused region and the P-type drain diffused region while the gate of the first N-type transistor is configured in a manner such that it is spanned between the N-type source diffused region and the N-type drain diffused region.

In the above configurations, an output from the oscillating element is applied to the gates of the first P-type transistor and the first N-type transistor. By the application of an output voltage of the oscillating element to these gates, an electric field is produced in the bottom portion of the gate between each respective source diffused region and drain diffused region. As a result of this, a conductive channel is created between the source diffused region and the drain diffused region over which the gate has been spanned. Application of an alternating voltage to the gates causes the first P-type transistor and the first N-type transistor to become alternately conductive thereby amplifying the oscillation output and feeding it back to the input terminal of the oscillating element. This feedback keeps the oscillation continuing.

When the first amplifier is configured with the first P-type transistor and the first N-type transistor fabricated by MOS process, a small and low cost oscillator can be configured. However, employment of such MOS process suffered a problem of an increase in the noise as many frequency components deviated from the desired oscillation frequency were generated below and above the desired oscillation frequency.

While the reason for this has not been fully investigated, the following mechanism may be considered. Namely, when voltage is applied to the gates and the corresponding parts, an electric field is produced leading to the creation of a conductive channel. Because of non-uniformity and the like of the structural compositions of the portion between the drain and the source, the conductive channel is disturbed and noise is produced by the disturbance.

DISCLOSURE OF THE INVENTION

An object of the present invention is to reduce the level of noise other than the desired oscillation frequency.

In order to attain the object, the present invention employs a configuration in which the gate length of the first N-type transistor is made longer than the gate length of the first P-type transistor.

In oscillators in general, when an N-type transistor and a P-type transistor are compared, the gate length of the N-type transistor is made shorter than the gate length of the P-type transistor in order to equalize the gain. As a result, a strong concentrated electric field is produced in the portion under the gate and between the drain and the source of the N-type transistor. In the present invention, however, the electric field intensity can be reduced by making the gate length of the N-type transistor longer than the gate length of the P-type transistor. Accordingly, the present invention can reduce the level of noise other than the oscillation frequency.

DESCRIPTION OF THE PREFERRED EMBODIMENTS

Figure 1:
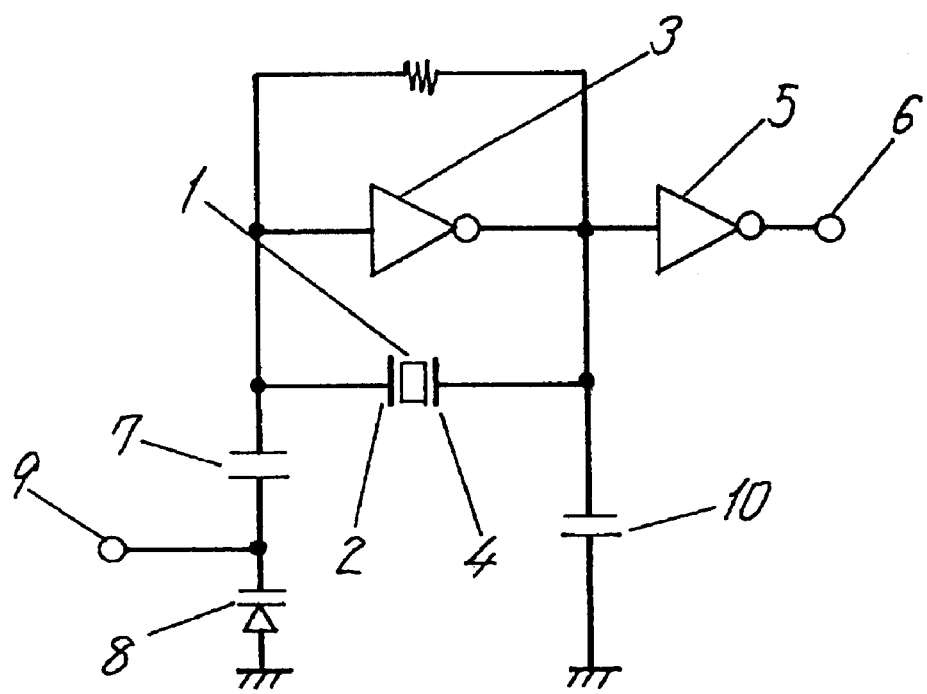
FIG. 1 is a circuit diagram of an exemplary embodiment of the present invention.

The oscillator of the present invention includes an oscillating element and a first amplifier connected to input and output terminals of the oscillating element. The first amplifier has a first P-type transistor and a first N-type transistor both fabricated by MOS process. A gate of the first P-type transistor and a gate of the first N-type transistor are connected to the output terminal of the oscillating element. A drain of the first P-type transistor and a drain of the first N-type transistor are connected to the input terminal of the oscillating element, and a source of the first P-type transistor is connected to a power supply terminal. A source of the first N-type transistor is connected to a grounding terminal. The gate of the first P-type transistor is configured in a manner such that it is spanned between a P-type source diffused region and a P-type drain diffused region. The gate of the first N-type transistor is configured in a manner such that it is spanned between an N-type source diffused region and an N-type drain diffused region. In the present invention, the gate length of the first N-type transistor is made longer than the gate length of the first P-type transistor. By making the gate length of the first N-type transistor longer than the gate length of the first P-type transistor, the present invention reduces the level of noise other than the oscillation frequency of the oscillation output.

Also, in the present invention, it is preferable to connect an input terminal of a second amplifier to the output terminal of the first amplifier. The second amplifier has a second P-type transistor and a second N-type transistor both fabricated by MOS process, and a gate of the second P-type transistor and a gate of the second N-type transistor are connected to the portion where drains of the first P-type transistor and the first N-type transistor are connected. The second amplifier is configured in a manner such that the drain of the second P-type transistor and the drain of the second N-type transistor are connected to an oscillation output terminal, a source of the second P-type transistor is connected to a power supply terminal, and a source of the second N-type transistor is connected to a grounding terminal. The gate of the second P-type transistor is configured in a manner such that it is spanned between a P-type source diffused region and a P-type drain diffused region. The gate of the second N-type transistor is configured in a manner such that it is spanned between an N-type source diffused region and an N-type drain diffused region. In the present invention, the gate length of the second N-type transistor is made longer than the gate length of the second P-type transistor. By making longer in this way, similarly to the case in which an output of the first amplifier supplies to an input of the second amplifier under a state in which a noise level of the first amplifier is reduced, it is possible for an oscillation output having a lower noise level by reducing a noise level of the second amplifier intervening between the first amplifier and the oscillation output terminal to be supplied to the oscillation output terminal.

Furthermore, it is preferable to make the gate length of the second N-type transistor longer than the gate length of the first N-type transistor. In the first amplifier, the level of noise other than the oscillation frequency of the oscillation output is reduced. In order to prevent this noise level from increasing again by being amplified by the second amplifier, the noise level of the second amplifier is reduced to the lower level than that of the first amplifier. In the present invention, by reducing like this, an oscillation output signal with low noise level can be obtained from the oscillation output terminal.

Referring now to the attached drawings, a description of an exemplary embodiment of the present invention will be given in the following. In FIG. 1, a quartz oscillating element 1 is used as the oscillating element, to the output terminal 2 of which the input terminal of a first amplifier 3 is connected, and the output terminal of the first amplifier 3 is connected to an input terminal 4 of the oscillating element 1. The input terminal of a second amplifier 5 is connected to the output terminal of the first amplifier 3, and an oscillation output terminal 6 is connected to the output terminal of the second amplifier 5. A capacitor 7 and a variable capacitance diode 8 are connected in series to the output terminal 2 of the quartz oscillating element 1, and a voltage control terminal 9 is connected to the cathode of the variable capacitance diode 8. Furthermore, a capacitor 10 is connected to the input terminal 4 of the quartz oscillating element 1.

In other words, in the present invention, when voltage is applied to the voltage control terminal 9, the capacitance of the variable capacitance diode 8 changes accordingly causing a change in the oscillation frequency of the quartz oscillating element 1. Also, the oscillation output of the quartz oscillating element 1 is amplified by the first amplifier 3 and fed back to the input terminal 4 of the quartz oscillating element 1 thereby maintaining the oscillation. Also, the oscillation output signal is led to the oscillation output terminal 6 through the second amplifier 5, and the output from this oscillation output terminal 6 is supplied to a PLL circuit in a portable telephone and the like.

Figure 2:
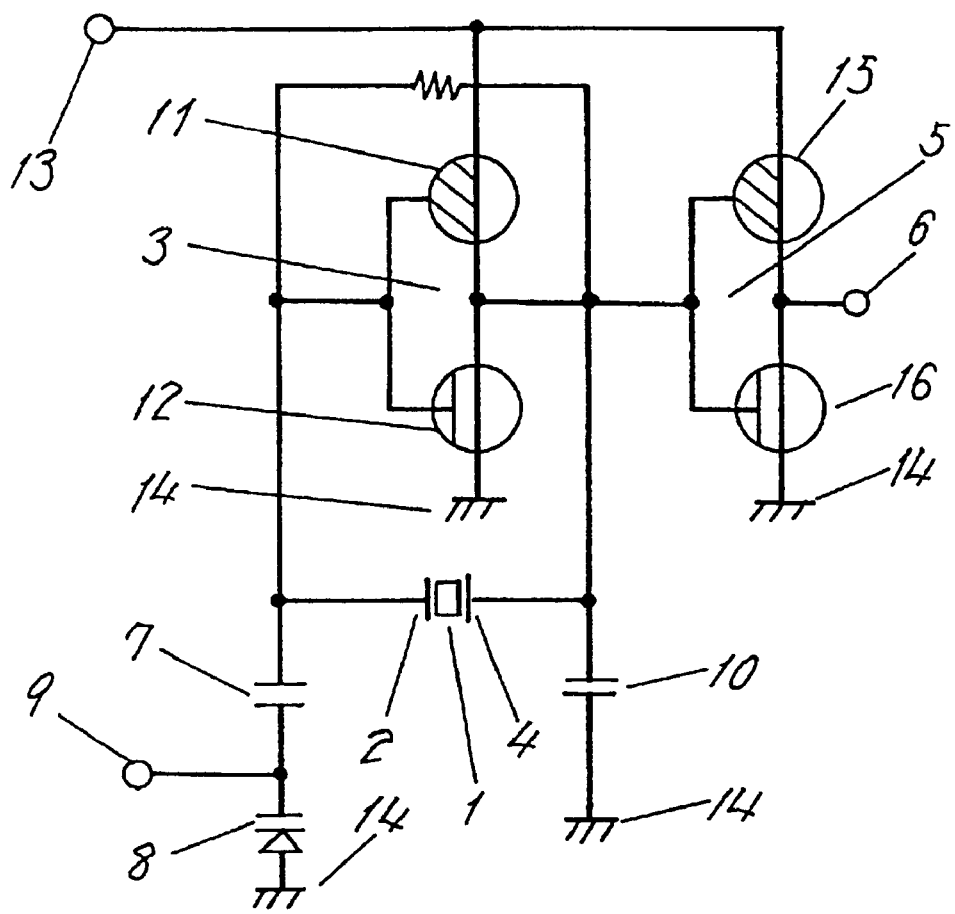
FIG. 2 is a circuit diagram showing the construction of an amplifier of the embodiment.

FIG. 2 is an illustration in detail of the first amplifier 3 and the second amplifier 5. As shown in FIG. 2, the amplifier 3 has a first P-type transistor 11 and a first N-type transistor both fabricated by MOS process. The gate of the first P-type transistor 11 and the gate of the first N-type transistor 12 are connected to the output terminal 2 of the quartz oscillating element 1, and the drain of the first P-type transistor 11 and the drain of the first N-type transistor 12 are connected to the input terminal 4 of the quartz oscillating element 1. Also, the source of the first P-type transistor 11 is connected to a power supply terminal 13, and the source of the first N-type transistor 12 is connected to a grounding terminal 14.

Furthermore, the second amplifier 5 has a second P-type transistor 15 and a second N-type transistor 16 both fabricated by MOS process. And the gate of the second P-type transistor 15 and the gate of the second N-type transistor 16 are connected to the portion at which the drains of the first P-type transistor 11 and the first N-type transistor 12 are connected, and the drain of the second P-type transistor 15 and the drain of the second N-type transistor 16 are connected to the oscillation output terminal 6. Furthermore, the source of the second P-type transistor 15 is connected to the power supply terminal 13 and the source of the second N-type transistor 16 is connected to the grounding terminal 14.

Figure 3:
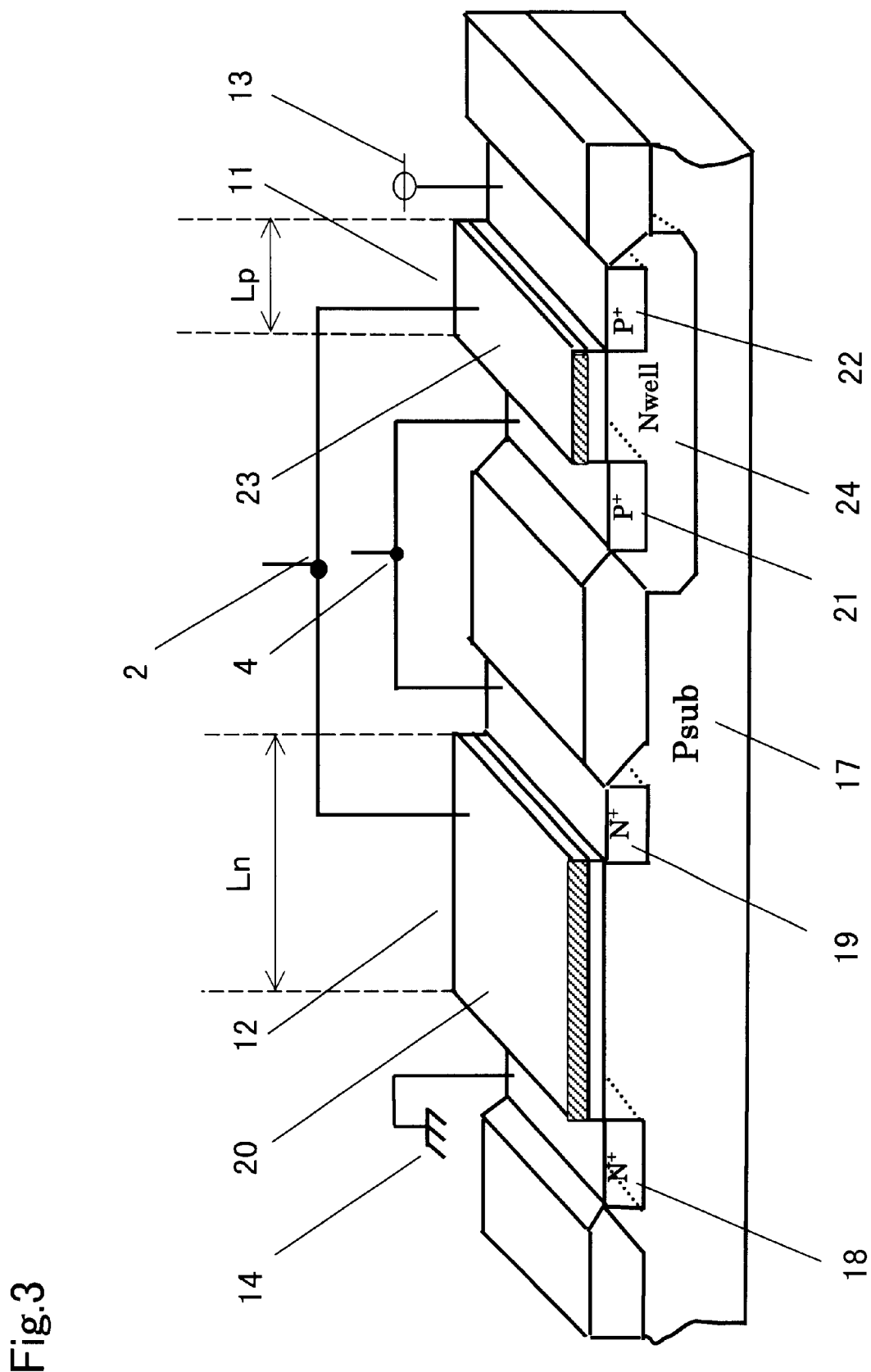
FIG. 3 is a perspective view of a practical configuration of the embodiment.

FIG. 3 illustrates a practical construction of the first P-type transistor 11 and the first N-type transistor 12. The first P-type transistor 11 and the first N-type transistor 12 are configured on a P-type substrate 17 composed of silicon. Put concretely, the present invention provides a configuration in which a gate 20 is spanned between an N-type source diffused region 18 and an N-type drain diffused region 19 on the substrate 17. The present invention also provides a configuration in which a gate 23 is spanned between a P-type drain diffused region 21 and a P-type source diffused region 22. Also, the source and drain of the first P-type transistor 11 are formed within an N well diffusion region 24.

FIG. 3 shows a configuration of an amplifier formed by a conventional MOS process. By the way, in this embodiment, the gate length Ln of the gate 20 of the first N-type transistor 12 is made longer than the gate length Lp of the gate 23 of the first P-type transistor 11.

Figure 4:
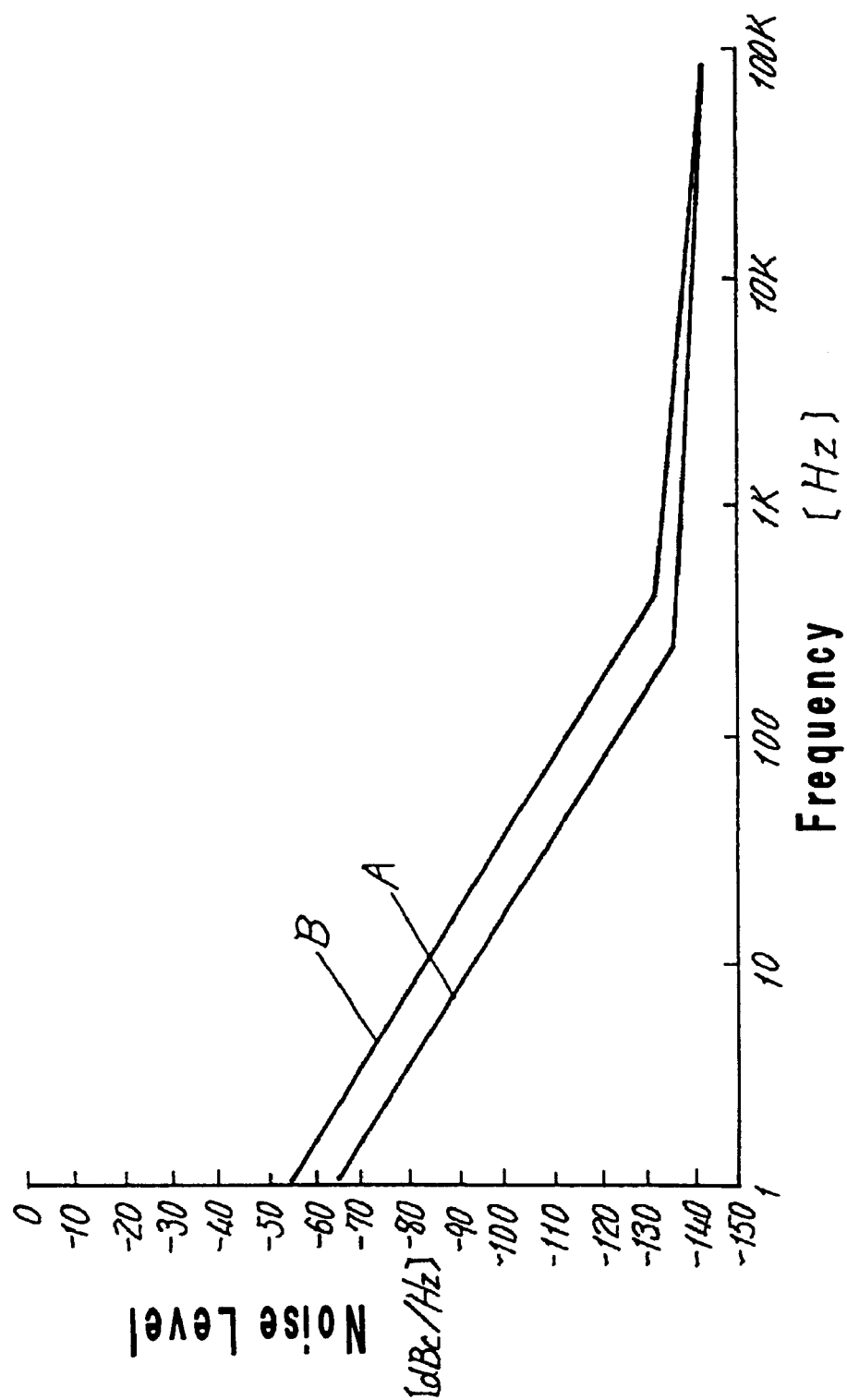
FIG. 4 is a graphical representation of the characteristics of the noise level of the oscillator of the present invention and a prior art.

In other words, by making the gate length Ln of the gate 20 longer than the gate length Lp of the gate 23, this embodiment makes it possible to greatly reduce the noise level of a frequency deviating from the desired oscillation frequency as shown by curve A in FIG. 4 as compared with a prior art curve B. To put it concretely, in this embodiment, the curve A in FIG. 4 was obtained by making the gate length Ln of the gate 20 to a value of 6.0 $\mu$m and the gate length Lp of the gate 23 to a value of 2.5 $\mu$m. The curve B in FIG. 4 shows the noise level for the case of Ln=2.0 $\mu$m and Lp=2.5 $\mu$m.

A description of the reason why the noise level is reduced as illustrated in FIG. 4 by making the gate length Ln of the gate 20 longer than the gate length Lp of the gate 23 will be given in the following.

While it is known that noise level is high in transistors fabricated by MOS process, in the present embodiment, by making the gate length Ln of the gate 20 shown in FIG. 3 longer, an electric field is produced in the region between the N-type source diffused region 18 and the N-type drain diffused region 19 when an oscillation output is applied to this portion through the output terminal 2 of the quartz oscillating element 1. By making the gate length Ln longer, the electric field intensity per unit area of the gate 20 is made smaller, and the noise level is reduced as shown in FIG. 4.

When voltage is applied to the gate 20, a conductive channel is formed on the portion of the substrate 17 between the N-type source diffused region 18 and the N-type drain diffused region 19, and current is caused to flow between the drain and the source of the first N-type transistor 12. Likewise, as the output voltage of the oscillation output terminal 2 is an alternating voltage, the generation of the current is also made alternately between the first N-type transistor 12 and the first P-type transistor 11.

Similarly to the first amplifier shown in FIG. 3, in the second P-type transistor 15 and the second N-type transistor 16 shown in FIG. 2, the gate length of the second N-type transistor 16 is made longer than the gate length of the second P-type transistor 15. In the present invention, the gate length of the second N-type transistor 16 is made further longer than the gate length of the gate 20 of the first N-type transistor 12. In other words, the oscillation output signal from the oscillation output terminal 6 is stabilized by further controlling the noise level of the second amplifier 5 than that of the first amplifier 3.

A description of the reason why the noise level can be controlled by making the gate lengths of the first and second N-type transistors 12 and 16 longer than the gate lengths of the corresponding P-type transistors as set forth above will be given using equations.

Noise of a transistor can be expressed by the following equation (Eqn. 1).

$$Vn^2 = \frac{K}{2 \times W \times L \times Cox} \times \frac{1}{f} \quad \text{(Eqn. 1)}$$

In Eqn. 1:

| | |
|---|---|
| Vn: | Equivalent noise referred to input |
| K: | Flicker coefficient |
| W: | Gate width of transistor |
| L: | Gate length of transistor |
| Cox: | Capacitance of gate oxide film |
| f: | Detuning frequency from the oscillation frequency |

Noise of an amplifier can be expressed by the following equation (Eqn. 2).

$$Vn^2 = \frac{\frac{Kp}{Wp \times Lp}\left(1 + \frac{Kn \times \mu n}{Kp \times \mu p}\left(\frac{Lp^2}{Ln}\right)\right)}{1 + \frac{\mu n \times Wn \times Lp}{\mu p \times Wp \times Ln}} \times \frac{1}{f} \quad \text{(Eqn. 2)}$$

In Eqn. 2:

| | |
|---|---|
| Vn: | Equivalent noise referred to input |
| Kp: | Flicker coefficient of P-type transistor |
| Kn: | Flicker coefficient of N-type transistor |
| Wp: | Gate width of P-type transistor |
| Wn: | Gate width of N-type transistor |
| Lp: | Gate length of P-type transistor |
| Ln: | Gate length of N-type transistor |
| $\mu p$: | Carrier mobility of P-type transistor |
| $\mu n$: | Carrier mobility of N-type transistor |
| f: | Detuning frequency from the oscillation frequency |

It can be understood from the above Eqns. 1 and 2 that the noise level can be effectively reduced by making the gate lengths Ln of the N-type transistors 12 and 16 longer than the gate lengths Lp of the P-type transistors 11 and 15.

INDUSTRIAL APPLICATION

As has been set forth above, the present invention controls the level of noise other than the oscillation frequency of the oscillation output by making the gate length of the first N-type transistor longer than the gate length of the first P-type transistor.

What is claimed is:

1. An oscillator including an oscillating element and a first amplifier connected between an input terminal and an output terminal of said oscillating element, said oscillator comprising:

said first amplifier has a first P-type transistor and a first N-type transistor both fabricated by a MOS process;

a gate of said first P-type transistor and a gate of said first N-type transistor are connected together for receiving an oscillating signal from said output terminal of said oscillating element;

a drain of said first P-type transistor and a drain of said first N-type transistor are connected together for providing a feedback signal to said input terminal of said oscillating element;

a source of said first P-type transistor is connected to a power supply;

a source of said first N-type transistor is connected to a ground potential;

said gate of said first P-type transistor is configured to provide an electrical path between a P-type source diffused region and a P-type drain diffused region;

said gate of said first N-type transistor is configured to provide an electrical path between an N-type source diffused region and an N-type drain diffused region;

said first N-type transistor has a gate length longer than a gate length of said first P-type transistor; and a second amplifier having an input terminal connected to an output terminal of said first amplifier, said second amplifier including a second P-type transistor and a second N-type transistor, said second N-type transistor having a longer gate length than said second P-type transistor.

2. The oscillator of claim 1 wherein:

a gate of said second P-type transistor and a gate of said second N-type transistor are connected to said drains of said first P-type transistor and first N-type transistor;

a drain of said second P-type transistor and a drain of said second N-type transistor are connected together to an output terminal of said second amplifier;

a source of said second P-type transistor is connected to a power supply;

a source of said second N-type transistor is connected to a ground potential;

said gate of said second P-type transistor is configured to provide an electrical path between a P-type source diffused region and a P-type drain diffused region; and said gate of said second N-type transistor is configured to provide an electrical path between an N-type source diffused region and an N-type drain diffused region.

3. The oscillator of claim 2 wherein the gate length of said second N-type transistor is made longer than the gate length of said first N-type transistor.

* * * * *